(12) United States Patent
Chen et al.

(10) Patent No.: US 11,670,384 B2
(45) Date of Patent: *Jun. 6, 2023

(54) MEMORY SYSTEM CAPABLE OF REDUCING THE READING TIME

(71) Applicant: YANGTZE MEMORY TECHNOLOGIES CO., LTD., Wuhan (CN)

(72) Inventors: Weirong Chen, Wuhan (CN); Qiang Tang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/587,998

(22) Filed: Jan. 28, 2022

(65) Prior Publication Data

US 2022/0157390 A1 May 19, 2022

Related U.S. Application Data

(63) Continuation of application No. 17/187,679, filed on Feb. 26, 2021, now Pat. No. 11,270,777, which is a continuation of application No. 16/436,926, filed on Jun. 11, 2019, now Pat. No. 10,998,059, which is a
(Continued)

(51) Int. Cl.
*G11C 16/30* (2006.01)
*G11C 16/24* (2006.01)
*G11C 16/28* (2006.01)

(52) U.S. Cl.
CPC .............. *G11C 16/30* (2013.01); *G11C 16/24* (2013.01); *G11C 16/28* (2013.01)

(58) Field of Classification Search
CPC ..................................................... G11C 16/30
See application file for complete search history.

(56) References Cited

U.S. PATENT DOCUMENTS 8,274,842 B1   9/2012  Hollmer et al.
9,378,834 B2   6/2016  Qian
9,530,470 B2  12/2016  Park
(Continued)

FOREIGN PATENT DOCUMENTS

CN   102013268 A   4/2011
CN   102385900 A   3/2012
(Continued)

*Primary Examiner* — Douglas King
(74) *Attorney, Agent, or Firm* — Bayes PLLC

(57) ABSTRACT

A bias circuit, a memory system, and a method of boosting a voltage level of a first bit line are provided. The bias circuit includes a first current generator, a second current generator, and a bit line bias generator. The first current generator is configured to generate a first replica charging current according to a charging current flowing through a voltage bias transistor. The second current generator is configured to generate a first replica cell current according to a cell current flowing through a common source transistor. The bit line bias generator is coupled to a first page buffer, the first current generator, and the second current generator, and configured to generate a bit line bias voltage, supplied to the first page buffer, according to a comparison of the first replica charging current and the first replica cell current.

20 Claims, 2 Drawing Sheets

Related U.S. Application Data continuation of application No. PCT/CN2019/085219, filed on Apr. 30, 2019.

(56) References Cited

U.S. PATENT DOCUMENTS

| | | | |
|---|---|---|---|
| 9,589,604 | B1 | 3/2017 | Fritsch |
| 9,754,640 | B1 * | 9/2017 | Yang ........................ G11C 7/12 |
| 10,121,548 | B2 | 11/2018 | Zhou |
| 2007/0097754 | A1 | 5/2007 | Spitz |
| 2012/0008385 | A1 * | 1/2012 | Yoo ........................ G11C 16/10 |
| | | | 365/185.2 |
| 2013/0223155 | A1 | 8/2013 | Oowada |
| 2015/0078098 | A1 | 3/2015 | Kwak |
| 2015/0228351 | A1 | 8/2015 | Wang |
| 2016/0099068 | A1 | 4/2016 | Kwak |
| 2019/0108886 | A1 | 4/2019 | Paolini |
| 2019/0279717 | A1 | 9/2019 | Sheng |

FOREIGN PATENT DOCUMENTS

| | | |
|---|---|---|
| CN | 102834597 A | 5/2014 |
| CN | 105336369 A | 2/2016 |
| CN | 106611610 A | 5/2017 |
| CN | 106782653 A | 5/2017 |
| CN | 108038057 A | 5/2018 |
| CN | 108074617 A | 5/2018 |
| CN | 108492840 A | 9/2018 |
| CN | 108615541 A | 10/2018 |
| CN | 109658966 A | 4/2019 |
| KR | 10-20120060507 A | 6/2012 |

* cited by examiner

US 11,670,384 B2

MEMORY SYSTEM CAPABLE OF REDUCING THE READING TIME

CROSS REFERENCE TO RELATED APPLICATIONS

This application is a continuation of U.S. application Ser. No. 17/187,679, filed on Feb. 26, 2021, which is a continuation of U.S. application Ser. No. 16/436,926, filed on Jun. 11, 2019, which is a continuation of International Application No. PCT/CN2019/085219, filed on Apr. 30, 2019, all of which are incorporated herein by reference in their entireties.

BACKGROUND

The present disclosure is related to a memory system, and more particularly to a memory system capable of reducing the reading time.

In a memory system, the data stored in the memory cell is usually read by sensing the data voltage on the bit line caused by the memory cell. For example, in a NAND memory read sequence, to read the data stored in a memory cell, the bit line coupled to the memory cell may be pre-charged to a predetermined level first. After the voltage of the bit line has settled, the word line coupled to the memory cell may be raised to cause the memory cell to generate current according to the data stored in the memory cell. If the memory cell has not been programmed, the memory cell may generate a significant current that pulls down the voltage of the bit line. Otherwise, if the memory cell has been programmed, the memory cell will not generate any currents or will only generate insignificant current so the voltage of the bit line will remain at the similar level. Therefore, by sensing the voltage of the bit line, the data stored in the memory cell can be read.

However, since the bit line is resistive and capacitive due to inevitable parasitic resistors and capacitors, the settling time of the bit line will contribute to a significant part of the total reading time. Furthermore, since the resistive and capacitive characteristics are unpredictable and varied with process, the settling time required by different memory cells are also different. Therefore, the worst case settling time is always applied to ensure the sensing accuracy. In addition, in prior art, the bit line is pre-charged with a master-slave transistor controlled by a predetermined voltage. In this case, the charging ability may decrease as the voltage of the bit line approaching to the desired level, which also increases the reading time.

SUMMARY

One embodiment of the present disclosure discloses a memory system. The memory system includes a plurality of memory cells, a voltage bias transistor, a page buffer, a common source transistor, and a bias circuit.

The first memory cells are coupled to a bit line. The voltage bias transistor has a first terminal for receiving a first system voltage, a second terminal, and a control terminal for receiving a first bias voltage.

The page buffer is coupled to the bit line and the second terminal of the voltage bias transistor. The page buffer charges the first bit line to the first system voltage according to a bit line bias voltage during a pre-charge operation, and forms a sensing path from the first bit line to a sensing amplifier during a sense operation.

The common source transistor has a first terminal coupled to the first bit line, a second terminal for receiving a second system voltage smaller than the first system voltage, and a control terminal for receiving a control signal.

The bias circuit includes a charging current reproduce unit, a cell current reproduce unit, a current comparator, and a bit line bias generator. The charging current reproduce unit is coupled to the voltage bias transistor. The charging current reproduce unit generates a charging reference voltage according to a charging current flowing through the voltage bias transistor. The cell current reproduce unit is coupled to the common source transistor. The cell current reproduce unit generates a cell reference voltage according to a cell current flowing through the common source transistor.

The current comparator is coupled to the charging current reproduce unit and the cell current reproduce unit. The current comparator includes a first current generator, and a second current generator. The first current generator generates a replica charging current according to the charging reference voltage, and the second current generator generates a replica cell current according to the cell reference voltage.

The bit line bias generator is coupled to the current comparator and the first page buffer. The bit line bias generator generates the bit line bias voltage according to a difference between the first replica charging current and the first replica cell current.

Another embodiment of the present disclosure discloses a bias circuit. The bias circuit includes a charging current reproduce unit, a cell current reproduce unit, a current comparator, and a bit line bias generator.

The charging current reproduce unit is coupled to a voltage bias transistor, and generates a charging reference voltage according to a charging current flowing through the voltage bias transistor. The cell current reproduce unit is coupled to a common source transistor, and generates a cell reference voltage according to a cell current flowing through the common source transistor.

The current comparator is coupled to the charging current reproduce unit and the cell current reproduce unit. The current comparator includes a first current generator, and a second current generator. The first current generator generates a replica charging current according to the charging reference voltage, and the second current generator generates a replica cell current according to the cell reference voltage.

The bit line bias generator is coupled to the current comparator and a page buffer, and generates a bit line bias voltage to control the page buffer for charging a bit line according to a difference between the replica charging current and the replica cell current.

The plurality of first memory cells are coupled to the bit line, the voltage bias transistor has a first terminal for receiving a first system voltage, a second terminal, and a control terminal for receiving a first bias voltage. The page buffer is coupled to the bit line and the second terminal of the voltage bias transistor, and charges the bit line to the first system voltage according to the bit line bias voltage during a pre-charge operation. The common source transistor has a first terminal coupled to the bit line, a second terminal for receiving a second system voltage smaller than the first system voltage, and a control terminal for receiving a control signal.

These and other objectives of the present disclosure will no doubt become obvious to those of ordinary skill in the art

DETAILED DESCRIPTION

Figure 1:
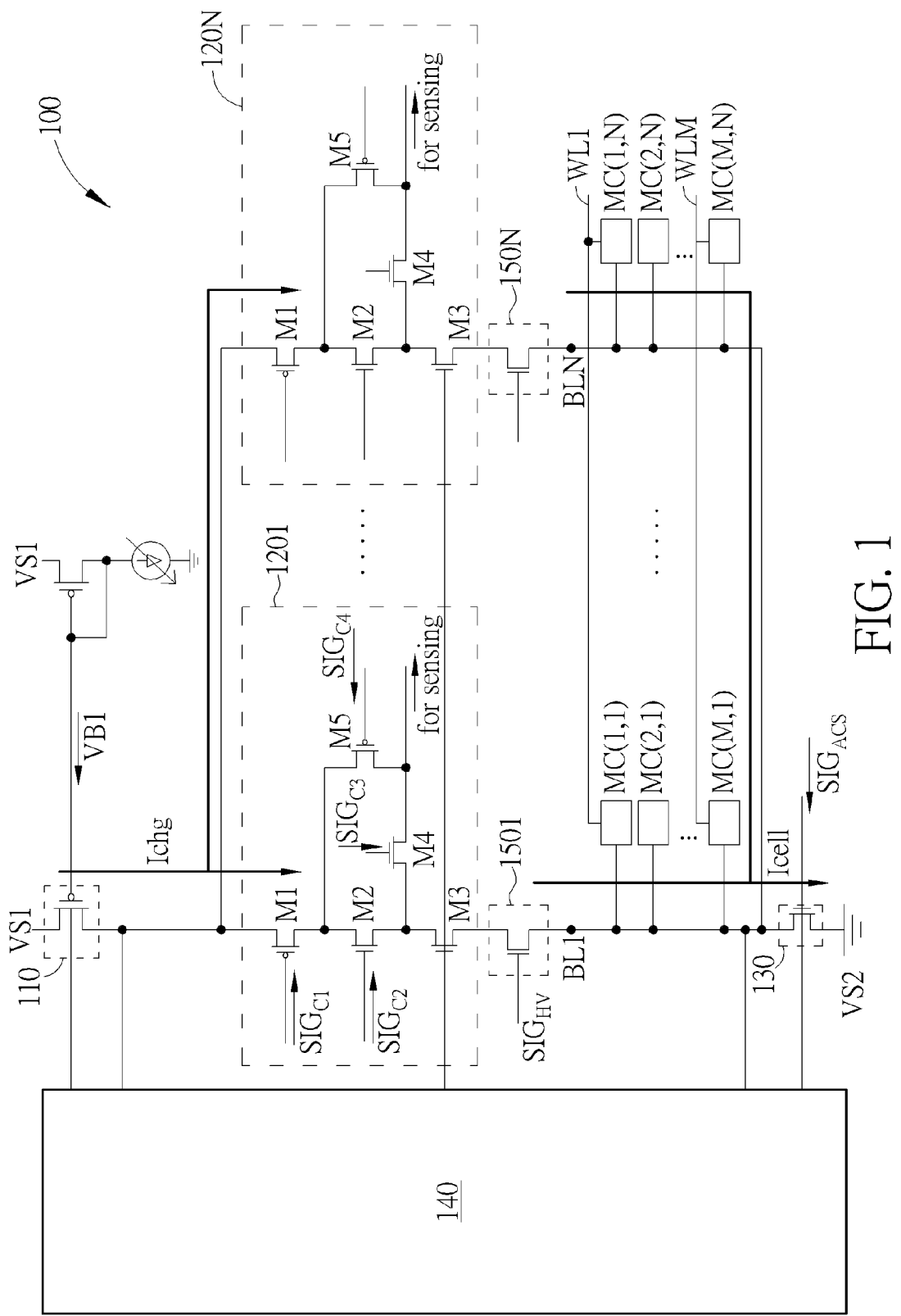
FIG. 1 shows a memory system according to one embodiment of the present disclosure.

FIG. 1 shows a memory system 100 according to one embodiment of the present disclosure. The memory system 100 includes a plurality of memory cells MC(1,1) to MC(M, N), a voltage bias transistor 110, page buffers 1201 to 120N, a common source transistor 130, and a bias circuit 140, where M and N are positive integers.

In FIG. 1, the memory cells MC(1,1) to MC(M,N) are disposed as an array. For example, the memory cells MC(1, 1) to MC(M,1) can be coupled to the bit line BL1, and the memory cells MC(N) to MC(M,N) can be coupled to the bit line BLN. Also, the memory cells MC(1,1) to MC(N) can be coupled to the word line WL1, and the memory cells MC(M,1) to MC(M,N) can be coupled to the word line WLM.

The voltage bias transistor 110 has a first terminal for receiving a first system voltage VS1, a second terminal, and a control terminal for receiving a first bias voltage VB1. The first bias voltage VB1 can turn on the voltage bias transistor 110 to charge the bit lines BL1 to BLN through the page buffers 1201 to 120N.

The page buffers 1201 to 120N can have the same structure. For example, the page buffer 1201 can be coupled to the bit line BL1 and the second terminal of the voltage bias transistor 110. The page buffer 1201 can charge the bit line BL1 to the first system voltage VS1 according to a bit line bias voltage VBLB during the pre-charge operation, and can form a sensing path from the bit line BL1 to a sensing amplifier during the sense operation.

In FIG. 1, the page buffer 1201 includes transistors M1 to M5. The transistor M1 has a first terminal coupled to the second terminal of the voltage bias transistor 110, a second terminal, and a control terminal for receiving a pre-charge control signal $SIG_{C1}$. The transistor M2 has a first terminal coupled to the second terminal of the transistor M1, a second terminal, and a control terminal for receiving a clamping control signal $SIG_{C2}$. The transistor M3 has a first terminal coupled to the second terminal of the second transistor M2, a second terminal coupled to the bit line BL1, and a control terminal for receiving the bit line bias voltage VBLB. The transistor M4 has a first terminal coupled to the second terminal of the transistor M2, a second terminal coupled to the sensing amplifier for sensing, and a control terminal for receiving a sensing control signal $SIG_{C3}$. The transistor M5 has a first terminal coupled to the second terminal of the transistor M1, a second terminal coupled to the second terminal of the transistor M4, and a control terminal for receiving a pre-charge select signal $SIG_{c4}$.

During the pre-charge operation, the transistors M1 and M2 will be turned on, and the transistor M3 will also be turned on to charge the bit line BL1. In some embodiments, the memory system 100 can further include high voltage passing transistors 1501 to 150N, and the page buffers 1201 to 120N can be coupled to the bit lines BL1 to BLN through the high voltage passing transistors 1501 to 150N respectively. In this case, the high voltage passing transistor 1501 will also be turned on by the pass signal SIGHV during the pre-charge operation of the bit line BL1.

Also, during the sense operation, the transistors M1, M2, and M3 may be turned off, and the transistor M4 can be turned on so that the voltage of the bit line BL can be sensed by the sense amplifier. The transistor M5 can be used to select the bit line to be pre-charged according to the requirement.

The common source transistor 130 has a first terminal coupled to the bit lines BL1 to BLN, a second terminal for receiving a second system voltage VS2 smaller than the first system voltage VS1, and a control terminal for receiving a control signal $SIG_{ACS}$.

During the pre-charge operation of the bit line BL1, the voltage bias transistor 110 and the common source transistor 130 can be turned on, and the transistors M1, M2, and M3 of the page buffer 1201 can also be turned on. Therefore, the bit line BL1 can be pre-charged. However, in prior art, as the voltage of the bit line BL1 increases, the gate-to-source voltage applied on the transistor M3 will decrease, thereby weakening the charging ability and increasing the required time for pre-charging. In the memory system 100, to address this issue, the bias circuit 140 can be used to generate and adjust the bit line bias voltage VBLB for controlling the transistor M3 according to the condition of the pre-charging operation.

Figure 2:
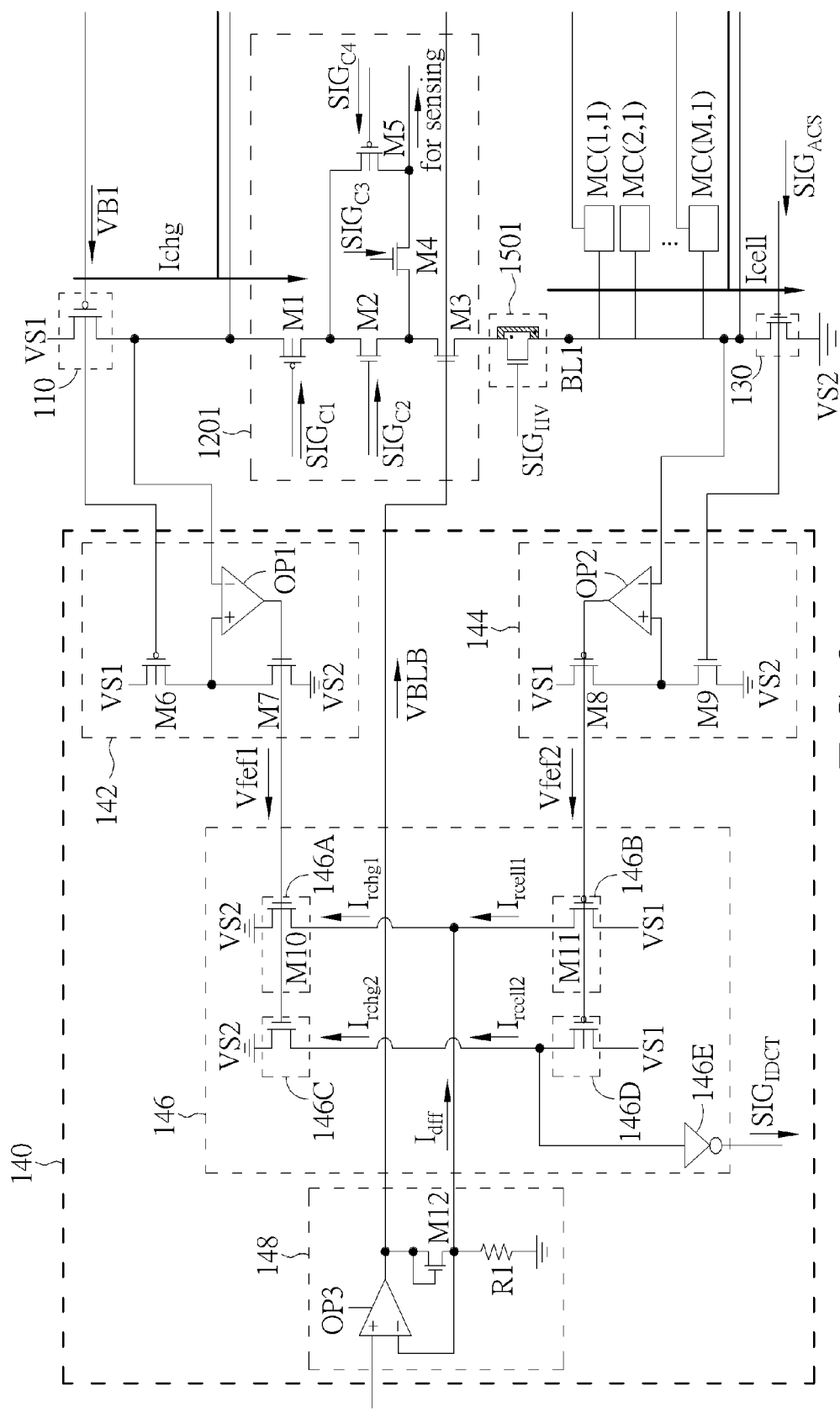
FIG. 2 shows a bias circuit according to one embodiment of the present disclosure.

FIG. 2 further shows the bias circuit 140 according to one embodiment of the present disclosure. The bias circuit 140 includes a charging current reproduce unit 142, a cell current reproduce unit 144, a current comparator 146, and a bit line bias generator 148.

The charging current reproduce unit 142 is coupled to the voltage bias transistor 110, and can generate a charging reference voltage Vref1 according to a charging current Ichg flowing through the voltage bias transistor 110.

The cell current reproduce unit 144 is coupled to the common source transistor 130, and can generate a cell reference voltage Vref2 according to a cell current Icell flowing through the common source transistor 130.

The current comparator 146 is coupled to the charging current reproduce unit 142 and the cell current reproduce unit 144. The current comparator 146 includes a first current generator 146A, and a second current generator 146B. The first current generator 146A can generate a replica charging current $I_{rchg1}$ according to the charging reference voltage Vref1, and the second current generator 146B can generate a replica cell current $I_{rcell1}$ according to the cell reference voltage Vref2.

The bit line bias generator 148 is coupled to the current comparator 146 and the page buffers 1201 to 120N. The bit line bias generator 148 can generate the bit line bias voltage VBLB according to a difference between the replica charging current litho and the replica cell current $I_{rcell1}$.

In some embodiments, part of the charging current Ichg flowing through the voltage bias transistor 110 may flow to the parasitic capacitors on the bit lines BL1 to BLN in the beginning of the pre-charge operation while the rest of the charging current Ichg will flow through the common source transistor 130. Later, when the parasitic capacitors are charged, the charging current Ichg will all flow through the common source transistor 130.

That is, in the beginning of the pre-charge operation, the charging current Ichg would be greater than the cell current $I_{rcell1}$, and, thus, the replica charging current $I_{rchg1}$ should be greater than the replica cell current $I_{rcell1}$. In this case, the difference between the replica charging current $I_{rchg1}$ and the replica cell current $I_{rcell1}$ will cause the bit line bias generator 148 to raise the bit line bias voltage VBLB so the transistor M3 can be fully turned on, thereby increasing the charging ability.

Later, when the parasitic capacitors are charged completely, the replica charging current $T_{rchg1}$ will be substantially equal to the replica cell current $I_{rcell1}$. In this case, it may imply that the bit line BL1 has been charged so the bit line bias generator 148 will keep the bit line bias voltage VBLB, and the sense operation can be performed correspondingly.

In some embodiments, the current comparator 146 can further include a third current generator 146C, a fourth current generator 146D, and an inverter 146E for generating a sensing indication signal $SIG_{IDCT}$. The third current generator 146C can generate a replica charging current $I_{rchg2}$ according to the charging reference voltage Vref1, and the fourth current generator 146D can generate a replica cell current $I_{rcell2}$ according to the cell reference voltage Vref2. The inverter 146E has an input terminal coupled to the third current generator 146C and the fourth current generator 146D, and an output terminal for outputting the sensing indication signal $SIG_{IDCT}$ according to the difference between the replica charging current $I_{rchg2}$ and the replica cell current $I_{rcell2}$. In this case, the sensing indication signal $SIG_{IDCT}$ will be flipped when the difference between the replica charging current $I_{rchg2}$ and the replica cell current $I_{rcell2}$ becomes zero, and the sense operation can be triggered by the flipped sensing indication signal $SIG_{IDCT}$ accordingly.

Since the bit line bias generator 148 can adjust the bit line bias voltage VBLB according to the charging status of the bit lines BL1 to BLN instantly, the charging ability can be maintained to be strong during the pre-charge operation. Also, since the charging status of the bit lines BL1 to BLN can be detected by the difference between the replica charging current litho and the replica cell current $I_{rcell1}$, the pre-charge operation can be terminated, and the sense operation can be triggered once the bit lines BL1 to BLN are pre-charged. That is, the pre-charge time can be optimized, and the pre-charge operation can be controlled without being affected by the process variation.

In FIG. 2, the charging current reproduce unit 142 includes transistors M6 and M7, and an operational amplifier OP1. The transistor M6 has a first terminal for receiving the first system voltage VS1, a second terminal, and a control terminal coupled to the control terminal of the voltage bias transistor 110. The operational amplifier OP1 has a positive input terminal coupled to the second terminal of the transistor M6, a negative input terminal coupled to the second terminal of the voltage bias transistor 110, and an output terminal for outputting the charging reference voltage Vref1. The transistor M7 has a first terminal coupled to the second terminal of the transistor M6, a second terminal for receiving the second system voltage VS2, and a control terminal coupled to the output terminal of the operational amplifier OP1.

In this case, the operational amplifier OP1 can ensure the transistor M6 to be biased under the same condition as the voltage bias transistor 110. Therefore, the charging current reproduce unit 142 is able to generate a reproduce current according to the charging current Ichg flowing through the voltage bias transistor 110.

Similarly, the cell current reproduce unit 144 includes transistors M8 and M9, and an operational amplifier OP2. The transistor M8 has a first terminal for receiving the first system voltage VS1, a second terminal, and a control terminal. The operational amplifier OP2 has a positive input terminal coupled to the second terminal of the transistor M8, a negative input terminal coupled to the bit lines BL1 to BLN, and an output terminal coupled to the control terminal of the transistor M8 for outputting the cell reference voltage Vref2. The transistor M9 has a first terminal coupled to the second terminal of the transistor M8, a second terminal for receiving the second system voltage VS2, and a control terminal coupled to the control terminal of the common source transistor 130.

In this case, the operational amplifier OP2 can ensure the transistor M9 to be biased under the same condition as the common source transistor 130. Therefore, the cell current reproduce unit 144 is able to generate a reproduce current according to the cell current Icell flowing through the common source transistor 130.

In FIG. 2, the first current generator 146A includes a transistor M10 having a first terminal, a second terminal for receiving the second system voltage VS2, and a control terminal for receiving the charging reference voltage Vref1. Also, the second current generator 146B includes a transistor M11 having a first terminal for receiving the first system voltage VS1, a second terminal coupled to the first terminal of the transistor M10, and a control terminal for receiving the cell reference voltage Vref2.

In addition, in FIG. 2, the transistors M7 and M10 are N-type transistors while the transistors M8 and M11 are P-type transistors. In this case, the transistor M10 will be biased under the same condition as the transistor M7 with the charging reference voltage Vref1, so the transistor M10 can generate the replica charging current $I_{rchg1}$ by mirroring the current flowing through the transistor M7. Similarly, the transistor M11 will be biased under the same condition as the transistor M8 with the cell reference voltage Vref2, so the transistor M11 can generate the replica cell current $I_{rcell1}$ by mirroring the current flowing through the transistor M8.

In FIG. 2, the bit line bias generator 148 includes an operational amplifier OP3, a transistor M12, and a resistor R1. The operation amplifier OP3 has a positive input terminal for receiving a second bias voltage VB2, a negative input terminal coupled to the first terminal of the transistor M10, and an output terminal for outputting the bit line bias voltage VBLB. The transistor M12 has a first terminal coupled to the output terminal of the operation amplifier OP3, a second terminal coupled to the negative input terminal of the operation amplifier OP3, and a control terminal coupled to the first terminal of the transistor M12. The resistor R1 has a first terminal coupled to the second terminal of the transistor M12, and a second terminal for receiving the second system voltage VS2.

In this case, when the replica charging current $I_{rchg1}$ is greater than the replica cell current $I_{rcell1}$, a differential current $I_{diff}$ will be fed to the bit line bias generator 148, thereby pulling down the voltage of the negative input terminal of the operational amplifier OP3 and raising the bit line bias voltage VBLB.

In some embodiments, the ratio of the size of the transistors M7 and M10 can be selected according to the system requirement to adjust the replica charging current $I_{rchg1}$. However, the ratio of the size of the transistors M8 and M11 should be the same as the ratio of the size of the transistors M7 and M10.

Similarly, the ratio of the size of the transistor M6 and the voltage bias transistor 110 can be selected according to the system requirement, and the ratio of the size of the transistor M6 and the voltage bias transistor 110 should be the same as the ratio of the size of the transistor M9 and the common source transistor 130.

Furthermore, in FIG. 2, the charging current reproduce unit 142 and the cell current reproduce unit 144 can use the operational amplifiers OP1 and OP2 to fix the bias conditions firmly; however, in some other embodiments, the charging current reproduce unit 142 and the cell current reproduce unit 144 may be implemented with other structures, such as the commonly used current mirrors.

Also, in FIG. 1, the bit lines BL1 to BLN can be pre-charged at the same time, however, in some other embodiments, the bit lines BL1 to BLN may also be pre-charged independently with the page buffers 1201 to 120N according to the system requirement.

In summary, the memory system and the bias circuit provided by the embodiments of the present disclosure can adjust the bit line bias voltage according to the charging status of the bit lines instantly, so the charging ability can be maintained to be strong during the pre-charge operation. Also, since the charging status of the bit lines can be detected by the difference between the replica charging current and the replica cell current, the pre-charge time can be optimized, and the pre-charge operation can be controlled without being affected by the process variation.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A bias circuit, coupled to a voltage bias transistor and a common source transistor and comprising:
a first current generator configured to generate a first replica charging current according to a charging current flowing through the voltage bias transistor;
a second current generator configured to generate a first replica cell current according to a cell current flowing through the common source transistor; and
a bit line bias generator coupled to a first page buffer, the first current generator, and the second current generator, and configured to generate a bit line bias voltage, supplied to the first page buffer, according to a comparison of the first replica charging current and the first replica cell current, wherein in response to the bit line bias voltage, the first page buffer charges a first bit line of a plurality of memory cells.

2. The bias circuit of claim 1, wherein:
the first page buffer comprises a first transistor comprising a control terminal controlled by the bit line bias voltage, a first terminal configured to receive a first system voltage, and a second terminal coupled to the first bit line; and
in response to the first replica charging current being greater than the first replica cell current, the bit line bias generator boosts the bit line bias voltage to turn on the first transistor, thereby charging the first bit line to the first system voltage.

3. The bias circuit of claim 1, wherein:
in response to the first replica charging current being substantially equal to the first replica cell current, the bit line bias generator maintains the bit line bias voltage.

4. The bias circuit of claim 1, wherein:
the bit line bias generator comprises a first operational amplifier comprising a positive input terminal configured to receive a first bias voltage and a negative input terminal; and
in response to the first replica charging current being greater than the first replica cell current, a differential current is fed to the negative input terminal of the first operational amplifier, and a voltage at the negative input terminal of the first operational amplifier is pulled down, thereby boosting the bit line bias voltage, wherein the differential current being determined according to the first replica charging current and the first replica cell current.

5. The bias circuit of claim 1, further comprising:
a charging current reproduce unit coupled to the voltage bias transistor and the first current generator, and configured to generate a charging reference voltage according to the charging current flowing through the voltage bias transistor, the first replica charging current being generated according to the charging reference voltage; and
a cell current reproduce unit coupled to the common source transistor and the second current generator, and configured to generate a cell reference voltage according to the cell current flowing through the common source transistor, the first replica cell current being generated according to the cell reference voltage.

6. The bias circuit of claim 5, further comprising:
a third current generator coupled to the charging current reproduce unit and configured to generate a second replica charging current according to the charging reference voltage;
a fourth current generator coupled to the cell current reproduce unit and configured to generate a second replica cell current according to the cell reference voltage; and
an inverter coupled to the third current generator and the fourth current generator, and configured to output a sensing indication signal according to the second replica charging current and the second replica cell current, the sensing indication signal being configured to trigger a sensing operation.

7. The bias circuit of claim 5, wherein:
the voltage bias transistor comprises a first terminal configured to receive a first system voltage, a second terminal, and a control terminal; and
the charging current reproduce unit comprises:
a second transistor comprising a first terminal configured to receive the first system voltage, a second terminal, and a control terminal coupled to the control terminal of the voltage bias transistor; and
a second operational amplifier comprising a positive terminal coupled to the second terminal of the second transistor, a negative terminal coupled to the second terminal of the voltage bias transistor, thereby ensuring the second transistor to be biased as the voltage bias transistor to output the charging reference voltage to an output terminal of the second operational amplifier.

8. The bias circuit of claim 7, wherein:
the charging current reproduce unit comprises a third transistor comprising a first terminal coupled to the second terminal of the second transistor, a second terminal configured to receive a second system voltage, and a control terminal coupled to the output terminal of the second operational amplifier; and the first current generator comprises a fourth transistor comprising a first terminal coupled to the bit line bias generator, a second terminal configured to receive the second system voltage, and a control terminal coupled to the output terminal of the second operational amplifier, the fourth transistor being configured to mirror a current flowing through the third transistor.

9. A memory system, comprising:
a voltage bias transistor coupled to a first page buffer;
a common source transistor coupled to a first bit line of a plurality of first memory cells; and
a bias circuit coupled to the voltage bias transistor, the common source transistor, and the first page buffer, and configured to:
generate a first replica charging current according to a charging current flowing through the voltage bias transistor;
generate a first replica cell current according to a cell current flowing through the common source transistor; and
generate a bit line bias voltage, supplied to the first page buffer, according to a comparison of the first replica charging current and the first replica cell current, wherein in response to the bit line bias voltage, the first page buffer charges the first bit line.

10. The memory system of claim 9, wherein:
the voltage bias transistor comprising a first terminal configured to receive a first system voltage and a second terminal coupled to the first page buffer;
the common source transistor comprising a first terminal coupled to the first bit line and a second terminal configured to receive a second system voltage; and
the first system voltage is greater than the second system voltage.

11. The memory system of claim 9, further comprising:
the first page buffer comprises a first transistor comprising a control terminal controlled by the bit line bias voltage, a first terminal configured to receive a first system voltage, and a second terminal coupled to the first bit line, wherein in response to the first replica charging current being greater than the first replica cell current, the bias circuit boosts the bit line bias voltage to turn on the first transistor, thereby charging the first bit line to the first system voltage.

12. The memory system of claim 9, wherein:
in response to the first replica charging current being substantially equal to the first replica cell current, the bias circuit maintains the bit line bias voltage.

13. The memory system of claim 9, wherein:
in response to the first replica charging current being greater than the first replica cell current, the bias circuit generates the bit line bias voltage according to a difference between the first replica charging current and the first replica cell current.

14. The memory system of claim 9, wherein the bias circuit comprises an operational amplifier configured to compare the first replica charging current and the first replica cell current and output the bit line bias voltage to the first page buffer according to the comparison of the first replica charging current and the first replica cell current.

15. The memory system of claim 9, wherein the bias circuit is further configured to:
generate a charging reference voltage according to the charging current flowing through the voltage bias transistor, and generate the first replica charging current according to the charging reference voltage; and
generate a cell reference voltage according to the cell current flowing through the common source transistor, and generate the first replica cell current according to the cell reference voltage.

16. The memory system of claim 15, wherein the bias circuit is further configured to:
generate a second replica charging current according to the charging reference voltage;
generate a second replica cell current according to the cell reference voltage; and
output a sensing indication signal according to the second replica charging current and the second replica cell current, the sensing indication signal being configured to trigger a sensing operation.

17. The memory system of claim 15, wherein the bias circuit comprises:
a second transistor biased as the voltage bias transistor to generate the charging reference voltage; and
a third transistor biased as the common source transistor to generate the cell reference voltage.

18. A method of boosting a voltage level of a bit line, comprising:
reproducing, through a bias circuit, a charging current flowing through a voltage bias transistor as a first replica charging current, the voltage bias transistor being coupled to a page buffer;
reproducing, through the bias circuit, a cell current flowing through a common source transistor as a first replica cell current, the common source transistor being coupled to the bit line of a plurality of memory cells;
generating, through the bias circuit, a bit line bias voltage, supplied to the page buffer, according to a comparison of the first replica charging current and the first replica cell current; and
in response to the bit line bias voltage, charging, through the page buffer, the bit line.

19. The method of claim 18, wherein:
in response to the first replica charging current being greater than the first replica cell current, generating the bit line bias voltage according to a difference between the first replica charging current and the first replica cell current.

20. The method of claim 18, wherein:
generating a charging reference voltage according to the charging current flowing through the voltage bias transistor, and generating the first replica charging current according to the charging reference voltage; and
generating a cell reference voltage according to the cell current flowing through the common source transistor, and generating the first replica cell current according to the cell reference voltage.

* * * * *